US011598736B2

(12) United States Patent
Althaus et al.

(10) Patent No.: US 11,598,736 B2
(45) Date of Patent: Mar. 7, 2023

(54) SYSTEMS AND METHODS FOR DETERMINING GRAIN DENSITY OF AN UNTREATED ROCK SAMPLE USING A GAS POROSIMETER AND NUCLEAR MAGNETIC RESONANCE

(71) Applicant: Saudi Arabian Oil Company, Dhahran (SA)

(72) Inventors: Stacey M. Althaus, Houston, TX (US); Jin-Hong Chen, Katy, TX (US); Mohammed Boudjatit, El Kennar (DZ)

(73) Assignee: Saudi Arabian Oil Company, Dhahran (SA)

( * ) Notice: Subject to any disclaimer, the term of this patent is extended or adjusted under 35 U.S.C. 154(b) by 133 days.

(21) Appl. No.: 17/220,346

(22) Filed: Apr. 1, 2021

(65) Prior Publication Data
US 2022/0317074 A1    Oct. 6, 2022

(51) Int. Cl.
*G01N 24/08* (2006.01)
*G01V 3/14* (2006.01)

(52) U.S. Cl.
CPC ............. *G01N 24/081* (2013.01); *G01V 3/14* (2013.01)

(58) Field of Classification Search
CPC ................................ G01N 24/081; G01V 3/14
See application file for complete search history.

(56) References Cited

U.S. PATENT DOCUMENTS

| 5,442,950 | A  | * | 8/1995  | Unalmiser ........... G01N 15/088 |
|           |    |   |         |                        73/152.05 |
| 10,422,916 | B2 |   | 9/2019  | Zhang et al. |
| 10,488,352 | B2 |   | 11/2019 | Chen et al. |
| 10,557,962 | B2 |   | 2/2020  | Chen et al. |
| 10,858,936 | B2 |   | 4/2020  | Chen et al. |
| 2016/0341652 | A1 |   | 11/2016 | Liu et al. |
| 2018/0081077 | A1 |   | 3/2018  | Chen et al. |
| 2018/0217073 | A1 |   | 8/2018  | Chen et al. |
| 2019/0049616 | A1 |   | 2/2019  | Zhang et al. |
| 2019/0331825 | A1 |   | 10/2019 | Zhang et al. |

(Continued)

FOREIGN PATENT DOCUMENTS

WO    WO 2019157413    8/2019

OTHER PUBLICATIONS

Chalmers et al., "Characterization of Gas Shale Pore Systems by Porosimetry, Pycnometry, Surface Area and Field Emission Scanning Electron Microscopy/Transmission Electron Microscopy Image Analyses: Examples from the Barnett, Woodford, Haynesville Marcellus and Doig Units," American Association of Petroleum Geologists (AAPG), AAPG Bulletin, Jun. 2012, 96:6, 1099-1119, 21 pages.

(Continued)

*Primary Examiner* — Jay Patidar
(74) *Attorney, Agent, or Firm* — Fish & Richardson P.C.

(57) ABSTRACT

Techniques for determining grain density of a rock sample include identifying an untreated rock sample that includes a solid matrix and a fluid entrained within the solid matrix; measuring, using a gas porosimeter, a grain density of the untreated rock sample; measuring, using nuclear magnetic resonance (NMR), a volume of the fluid entrained within the solid matrix; and determining, based on the measured grain density of the untreated rock sample and the measured volume of the fluid, a grain density of the solid matrix of the untreated rock sample.

38 Claims, 4 Drawing Sheets

(56) References Cited

U.S. PATENT DOCUMENTS

2019/0331826 A1    10/2019    Zhang et al.
2020/0102824 A1    4/2020    Chen et al.

OTHER PUBLICATIONS

Dean et al., "A convenient method for the determination of water in petroleum and other organic emulsions," The Journal of Industrial & Engineering Chemistiy, May 1920, 12:5, 486-490, 5 pages.

Dunn et al., Nuclear Magnetic Resonance: Petrophysical and Logging Applications. Elsevier Science, Jan. 2002, 314 pages.

Handbook of Physical Properties of Rocks (1984): vol. III, CRC Press Revivals Editor Robert S. Carmichael, 355 pages.

Luffel et al., "New Core Analysis Methods for Measuring Reservoir Rock Properties of Devonian Shale," Journal of Petroleum Technology (JPT), Nov. 1992, 44:11, 1184-1190, 7 pages.

Passey et al., "From Oil-Prone Source Rock to Gas-Producing Shale Reservoir—Geologic and Petrophysical Characterization and Unconventional Shale-Gas Reservoirs," SPE 131350, Society of Petroleum Engineers (SPE), presented at the CSP/SPE International Oil and Gas Conference and Exhibition in China, Beijing, China, Jun. 2-10, 2010, 29 pages.

Sidian et al., "Effect of Mineralogy on Nuclear Magnetic Resonance Surface Relaxivity: A Case Study of Middle Bakken and Three Forks Formations," Fuel 2015, 161, 197-206, 10 pages.

Timur, "Pulsed nuclear magnetic resonance studies of porosity, movable fluid, and permeability of sandstones." Journal of Petroleum Technology 21.06, Jun. 1969, 775-786, 12 pages.

Wang et al., "High-Field Nuclear Magnetic Resonance Observation of Gas Shale Fracturing by Methane Gas," Energy and Fuels, 2014, 28: 3638-3644, 7 pages.

\* cited by examiner

| Sample # | Fluid Porosity ($\rho_f$) from NMR (%) | Grain Density of Sample ($\rho^{gp}_g$) from Gas Porometry (g/cc) | Determined Grain Density ($\rho_g$) (g/ml) |
|---|---|---|---|
| 1 | 1.56 | 2.49 | 2.51 |
| 2 | 2.68 | 2.47 | 2.51 |
| 3 | 1.92 | 2.59 | 2.62 |
| 4 | 3.15 | 2.47 | 2.52 |
| 5 | 2.57 | 2.44 | 2.48 |
| 6 | 2.43 | 2.46 | 2.49 |
| 7 | 2.53 | 2.57 | 2.61 |
| 8 | 1.71 | 2.72 | 2.75 |
| 9 | 2.01 | 2.49 | 2.52 |
| 10 | 2.95 | 2.55 | 2.59 |
| 11 | 2.09 | 2.53 | 2.56 |
| 12 | 2.29 | 2.48 | 2.52 |
| 13 | 1.90 | 2.73 | 2.76 |
| 14 | 2.69 | 2.61 | 2.66 |
| 15 | 2.49 | 2.56 | 2.60 |
| 16 | 1.22 | 2.68 | 2.70 |
| 17 | 5.80 | 2.45 | 2.54 |
| 18 | 4.47 | 2.57 | 2.64 |
| 19 | 3.76 | 2.61 | 2.68 |
| 20 | 1.25 | 2.63 | 2.65 |
| 21 | 1.63 | 2.58 | 2.60 |
| 22 | 2.55 | 2.46 | 2.50 |

FIG. 3

SYSTEMS AND METHODS FOR DETERMINING GRAIN DENSITY OF AN UNTREATED ROCK SAMPLE USING A GAS POROSIMETER AND NUCLEAR MAGNETIC RESONANCE

TECHNICAL FIELD

The present disclosure describes systems and methods for determining grain density of a rock sample.

BACKGROUND

Grain density of a rock sample can be used as a parameter in evaluating a geological formation. For example, grain density can give an indication of the mineralogy of the rock. Grain density can also be a prerequisite parameter in evaluating formation porosity in density logging. When grain density is used in density logging, the accuracy of the measured grain density should be better than 0.015 grains per milliliter so that the accuracy of measured porosity from a density log can be within 1 percent unit.

SUMMARY

In an example implementation, a method of determining grain density of a rock sample includes (i) identifying an untreated rock sample that includes a solid matrix and a fluid entrained within the solid matrix; (ii) measuring, using a gas porosimeter, a grain density of the untreated rock sample; (iii) measuring, using nuclear magnetic resonance (NMR), a volume of the fluid entrained within the solid matrix; and (iv) determining, based on the measured grain density of the untreated rock sample and the measured volume of the fluid, a grain density of the solid matrix of the untreated rock sample.

In an aspect combinable with the example implementation, the untreated rock sample is free from chemical cleaning subsequent to removal of the untreated rock sample from a subterranean formation.

In another aspect combinable with any of the previous aspects, the untreated rock sample is pre-processed prior to step (i).

Another aspect combinable with any of the previous aspects further includes de-processing the untreated rock sample prior to step (ii).

Another aspect combinable with any of the previous aspects further includes, based on the determined grain density of the solid matrix, determining at least one of a rock type of the untreated rock sample; a reservoir type of the subterranean formation; or a formation porosity of the subterranean formation.

In another aspect combinable with any of the previous aspects, the untreated rock sample includes a cylindrical plug.

In another aspect combinable with any of the previous aspects, the cylindrical plug is 1 inch in diameter and about 1 inch in length.

In another aspect combinable with any of the previous aspects, step (ii) includes measuring the grain density of the untreated rock sample using the gas porosimeter using a Boyle's law technique with an inert gas.

In another aspect combinable with any of the previous aspects, the inert gas includes at least one of nitrogen, helium, or argon.

In another aspect combinable with any of the previous aspects, step (iii) includes measuring, using NMR, the volume of the fluid entrained within the solid matrix with at least one of $T_1$ or $T_2$ measurements of the untreated rock sample.

In another aspect combinable with any of the previous aspects, step (iii) includes determining a density of the fluid entrained within the solid matrix; and determining a porosity of the fluid entrained within the solid matrix based on the determined volume of the liquid and a volume of the untreated rock sample.

In another aspect combinable with any of the previous aspects, determining the density of the fluid entrained within the solid matrix includes identifying a type of the fluid based on the NMR measurements; and determining the density of the fluid based on the identified type of the fluid.

In another aspect combinable with any of the previous aspects, step (iv) includes determining the grain density of the solid matrix of the untreated rock sample based on the determined density and porosity of the fluid entrained within the solid matrix and the determined grain density of the untreated rock sample.

In another aspect combinable with any of the previous aspects, determining the grain density of the solid matrix of the untreated rock sample based on the determined density and porosity of the fluid entrained within the solid matrix and the measured grain density of the untreated rock sample includes determining the grain density of the solid matrix from:

$$\rho_g = \frac{\left(\rho_g^{g.p.} - \rho_f \phi_f\right)}{(1 - \phi_f)},$$

where $\rho_g$ is the grain density of the solid matrix, $\rho_g^{g.p.}$ is the measured grain density of the untreated rock sample, $\rho_f$ is the determined density of the fluid entrained within the solid matrix, and $\phi_f$ is the determined porosity of the fluid entrained within the solid matrix.

In another example implementation, a system for determining grain density of a rock sample includes a gas porosimeter configured to determine a grain density of an untreated rock sample that includes a solid matrix and a fluid entrained within the solid matrix; a nuclear magnetic resonance (NMR) measurement device configured to determine one or more NMR measurements of the untreated rock sample; and a control system configured to perform operations. The operations include identifying a measured grain density of the untreated rock sample from the gas porosimeter; determining a measured volume of the fluid entrained within the solid matrix from the NMR measurements; and determining, based on the measured grain density of the untreated rock sample and the measured volume of the fluid, a grain density of the solid matrix of the untreated rock sample.

In an aspect combinable with the example implementation, the untreated rock sample is free from chemical cleaning subsequent to removal of the untreated rock sample from a subterranean formation.

In another aspect combinable with any of the previous aspects, the untreated rock sample includes a de-processed, untreated rock sample.

In another aspect combinable with any of the previous aspects, the de-processed, untreated rock sample includes the untreated rock sample unsealed from an ambient environment.

In another aspect combinable with any of the previous aspects, the control system is configured to perform operations further including at least one of a rock type of the untreated rock sample based on the determined grain density of the solid matrix; a reservoir type of the subterranean formation based on the determined grain density of the solid matrix; or a formation porosity of the subterranean formation based on the determined grain density of the solid matrix.

In another aspect combinable with any of the previous aspects, the untreated rock sample includes a cylindrical plug.

In another aspect combinable with any of the previous aspects, the cylindrical plug is 1 inch in diameter and about 1 inch in length.

In another aspect combinable with any of the previous aspects, the gas porosimeter is configured to determine the grain density by measuring the grain density of the untreated rock sample using a Boyle's law technique with an inert gas.

In another aspect combinable with any of the previous aspects, the inert gas includes at least one of nitrogen, helium, or argon.

In another aspect combinable with any of the previous aspects, the NMR measurements include at least one of $T_1$ or $T_2$ measurements of the untreated rock sample.

In another aspect combinable with any of the previous aspects, the operation of determining the measured volume of the fluid entrained within the solid matrix from the NMR measurements includes determining a density of the fluid entrained within the solid matrix based on the NMR measurements; and determining a porosity of the fluid entrained within the solid matrix based on the determined volume of the liquid and a volume of the untreated rock sample.

In another aspect combinable with any of the previous aspects, determining the density of the fluid entrained within the solid matrix includes identifying a type of the fluid based on the NMR measurements; and determining the density of the fluid based on the identified type of the fluid.

In another aspect combinable with any of the previous aspects, the operation of determining, based on the measured grain density of the untreated rock sample and the measured volume of the fluid, the grain density of the solid matrix of the untreated rock sample includes determining the grain density of the solid matrix of the untreated rock sample based on the determined density and porosity of the fluid entrained within the solid matrix and the determined grain density of the untreated rock sample.

In another aspect combinable with any of the previous aspects, the operation of determining the grain density of the solid matrix of the untreated rock sample based on the determined density and porosity of the fluid entrained within the solid matrix and the measured grain density of the untreated rock sample includes determining the grain density of the solid matrix from:

$$\rho_g = \frac{(\rho_g^{g.p.} - \rho_f \phi_f)}{(1 - \phi_f)},$$

where $\rho_g$ is the grain density of the solid matrix, $\rho_g^{g.p.}$ is the measured grain density of the untreated rock sample, $\rho_f$ is the determined density of the fluid entrained within the solid matrix, and $\phi_f$ is the determined porosity of the fluid entrained within the solid matrix.

In another aspect combinable with any of the previous aspects, the control system is configured to perform operations further including at least one of controlling the gas porosimeter to determine the grain density of an untreated rock sample; or controlling the NMR measurement device to determine the one or more NMR measurements of the untreated rock sample.

In another example implementation, a computer-implemented method performed with a computing system that includes one or more hardware processors includes determining, with the one or more hardware processors, a value of a measurement of a grain density taken by a gas porosimeter of an untreated rock sample that includes a solid matrix and a fluid entrained within the solid matrix; determining, with the one or more hardware processors, a value of a measurement of a volume taken by a nuclear magnetic resonance (NMR) device of the fluid entrained within the solid matrix; and determining, with the one or more hardware processors, a grain density of the solid matrix of the untreated rock sample based on the measured value of the grain density of the untreated rock sample and the measured value of the volume of the fluid.

In an aspect combinable with the example implementation, the untreated rock sample is free from chemical cleaning subsequent to removal of the untreated rock sample from a subterranean formation.

Another aspect combinable with any of the previous aspects further includes, based on the determined grain density of the solid matrix, determining, with the one or more hardware processors, at least one of a rock type of the untreated rock sample; a reservoir type of the subterranean formation; or a formation porosity of the subterranean formation.

In another aspect combinable with any of the previous aspects, the measurement of the grain density of the untreated rock sample taken by the gas porosimeter includes a measurement of the grain density of the untreated rock sample taken by the gas porosimeter using a Boyle's law technique with an inert gas.

In another aspect combinable with any of the previous aspects, the measurement of the volume of the fluid entrained within the solid matrix taken by the NMR device includes one or more $T_1$ or $T_2$ measurements of the untreated rock sample.

In another aspect combinable with any of the previous aspects, determining the value of the measurement of the volume taken by the NMR device of the fluid entrained within the solid matrix includes determining, with the one or more hardware processors, a density of the fluid entrained within the solid matrix; and determining, with the one or more hardware processors, a porosity of the fluid entrained within the solid matrix based on the determined volume of the liquid and a volume of the untreated rock sample.

In another aspect combinable with any of the previous aspects, determining the density of the fluid entrained within the solid matrix includes identifying, with the one or more hardware processors, a type of the fluid based on the NMR measurements; and determining, with the one or more hardware processors, the density of the fluid based on the identified type of the fluid.

In another aspect combinable with any of the previous aspects, determining the grain density of the solid matrix of the untreated rock sample includes determining, with the one or more hardware processors, the grain density of the solid matrix of the untreated rock sample based on the determined density and porosity of the fluid entrained within the solid matrix and the determined grain density of the untreated rock sample.

In another aspect combinable with any of the previous aspects, determining the grain density of the solid matrix of the untreated rock sample based on the determined density and porosity of the fluid entrained within the solid matrix and the measured grain density of the untreated rock sample includes determining, with the one or more hardware processors, the grain density of the solid matrix from $$\rho_g = \frac{(\rho_g^{g.p.} - \rho_f \phi_f)}{(1 - \phi_f)},$$

where $\rho_g$ is the grain density of the solid matrix, $\rho_g^{g.p.}$ is the measured grain density of the untreated rock sample, $\rho_f$ is the determined density of the fluid entrained within the solid matrix, and $\phi_f$ is the determined porosity of the fluid entrained within the solid matrix.

Implementations of systems and methods for determining grain density of a rock sample according to the present disclosure may include one or more of the following features. For example, implementations according to the present disclosure may more accurately determine grain density of a rock sample by determining grain density of a solid portion (for example, solid matrix) of the rock sample exclusive of any entrained fluid within the rock sample. As another example, implementations according to the present disclosure may determine such accurate grain density of an untreated rock sample rather than a chemically cleaned (and possibly dried) rock sample as required in conventional techniques. As another example, implementations according to the present disclosure may therefore save time conventionally spent cleaning such sample but also allows measurement without possible chemical alteration to the sample.

The details of one or more implementations of the subject matter described in this disclosure are set forth in the accompanying drawings and the description below. Other features, aspects, and advantages of the subject matter will become apparent from the description, the drawings, and the claims.

BRIEF DESCRIPTION OF THE DRAWINGS

FIG. 3 is a table that shows measured and determined parameters of a system for determining a grain density of a rock sample according to the present disclosure.

DETAILED DESCRIPTION

The present disclosure describes example implementations of systems and methods for determining a grain density of a rock sample and, more particularly, grain density of a solid matrix portion of the rock sample. Grain density, also known as matrix density, of a rock sample refers to a density of the solid matrix of the rock sample, which, as a whole, can include the solid matrix as well as a fluid (for example, liquid, mixed phase fluid, gas) that is entrained within the solid matrix due to the porosity of the solid matrix. In example implementations according to the present disclosure, the described systems and methods can determine a grain density of the solid matrix of an untreated rock sample, such as a rock sample taken from a subterranean formation that has not been chemically cleaned or processed. Thus, as compared to conventional grain density determinations, which rely on a rock sample that has been treated or processed (for example, cleaned and dried of entrain fluids from the subterranean formation), example implementations of systems and methods according to the present disclosure determine the grain density without the need for such processing.

Figure 1:
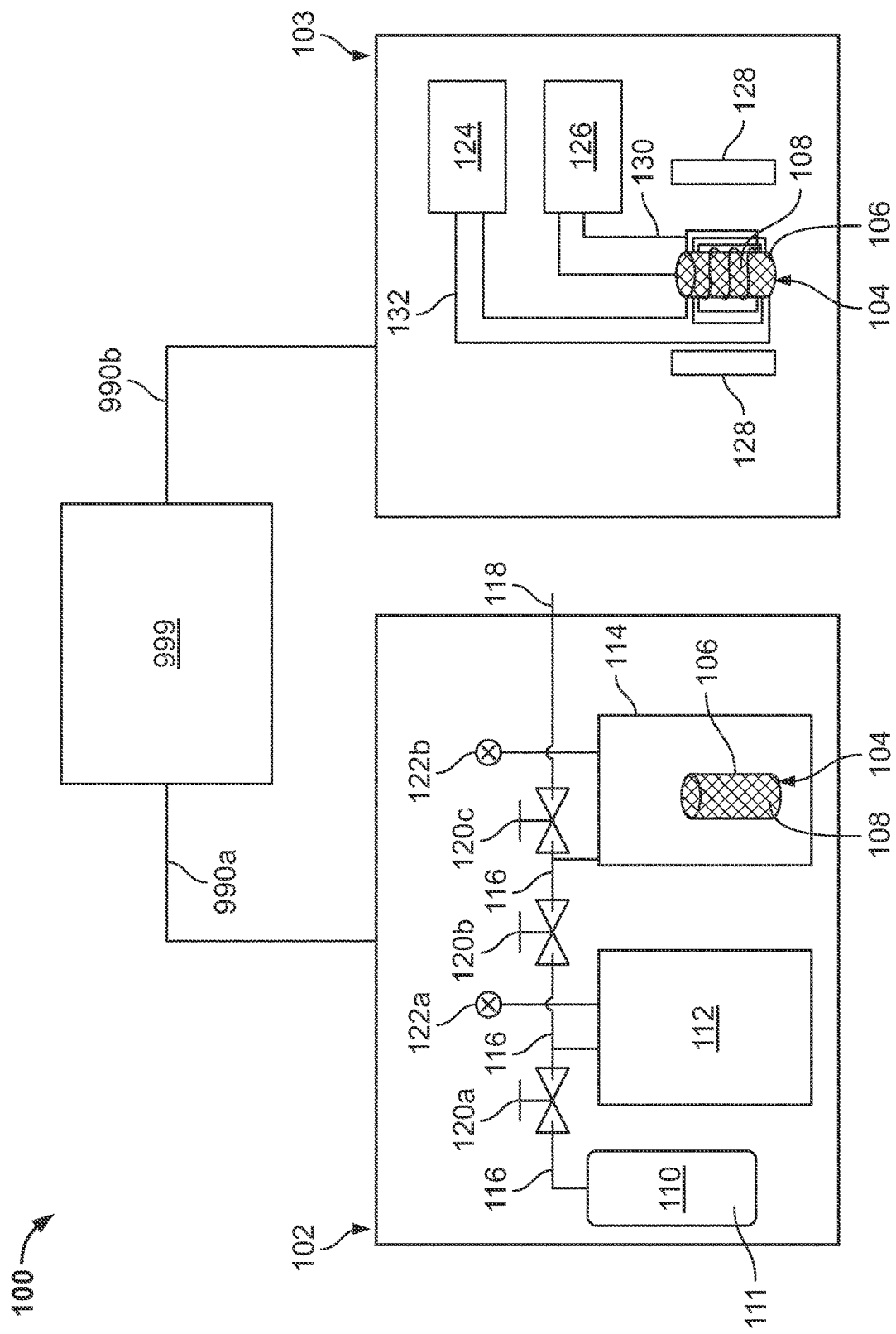
FIG. 1 is a schematic diagram of an example implementation of a system for determining a grain density of a rock sample according to the present disclosure.

FIG. 1 is a schematic diagram of an example implementation of a system 100 for determining a grain density of a rock sample according to the present disclosure. Generally, the system 100 (and associated process of operation of the system 100) can be used to accurately determine grain density of an untreated rock sample 104 from gas porosimetry-measured grain density in combination with nuclear magnetic resonance (NMR) measurements to measure a volume of liquid entrained in the untreated rock sample for correction. As noted, the untreated rock sample 104 need not be chemically cleaned in order for the gas porosimetry and NMR measurements to proceed. In the present disclosure, for example, chemical cleaning can refer to one or more processes of using a solvent, typically chloroform, toluene, ethanol, dichloromethane, or a combination of these or other chemicals, to dissolve and remove trapped fluids within a rock sample (also referred to as a core sample). This can be done using a variety of methods (for example, Dean Stark and Soxhlet extraction). The untreated rock sample 104 of the present disclosure, however, can be a core sample (for example, a cylindrical rock sample of about 1 inch in diameter and 1 inch in length) from a subterranean formation that is in an "as received" state exclusive of any chemical cleaning.

The untreated rock sample 104 is formed of a solid matrix 106 and a fluid 108 that is entrained within the solid matrix 106. In some aspects, the fluid 108 is a hydrocarbon fluid, such as oil, gas, a mixture thereof, or a mixture of hydrocarbon fluids and non-hydrocarbon fluids (for example, water). The fluid 108 is often in liquid state, but can also be a pure gas or mixed-phase fluid.

As shown in FIG. 1, the system 100 includes a gas porosimeter 102 in which the untreated rock sample 104 can be placed and analyzed to determine an overall grain density of the untreated rock sample 104 as a whole (in other words, a grain density of the untreated rock sample 104 that accounts for both the solid matrix 106 as well as the fluid 108 rather than a grain density of the solid matrix 106 alone). In this example, the gas porosimeter 102 is a Boyle's law gas porosimeter; however, the present disclosure contemplates that any appropriate gas porosimeter that can determine a grain density of the untreated rock sample 104, as a whole, can be used.

The illustrated gas porosimeter 102 includes a source 110 of a pressurized gas 111. In some aspects, the pressurized gas 111 comprises an inert gas, such as helium, nitrogen, argon, or a combination thereof (or other gas). As shown, the source 110 is fluidly coupled to a reference test cell 112 and a sample test cell 114 (in which the untreated rock sample 104 is placed). A number of interconnected conduits 116 (for example, tubing, piping, or other conduits that create fluid flow paths) fluidly connect the source 110, the reference test cell 112, and the sample test cell 114.

Coupled within the conduits 116, in this example implementation, are valves 120a-120c (for example, zero displacement volume ball valves). Other valves can also be included within the gas porosimeter 102. Generally, the valves 120a-120c are controllable (for example, manually or by a control system 999 as described in more detail later) to flow the pressurized gas 111 from the source 110 into the reference test cell 112 and the sample test cell 114. The valves 120a-120c are also controllable to seal a particular volume or amount of the pressurized gas 111 within the reference test cell 112 or the sample test cell 114 (or both).

Also coupled within the conduits 116, in this example implementation, are pressure gauges (or sensors) 122a and 122b. In this example, pressure gauge 122a can measure a pressure of the reference test cell 112 (or more specifically, a pressure of the pressurized gas 111 contained within the reference test cell 112).

Although shown schematically as contained within the gas porosimeter 102, one or more components of the gas porosimeter 102 can be contained in a housing or container, while other components are located external to such housing or container. For example, the illustrated components except for the source 110 of the pressurized gas 111 can be contained in a housing or incubator. Further, within such a container or incubator, the illustrated components (for example, the reference test cell 112, the sample test cell 114, one or more of the valves 120a-120c, and one or more of the pressure gauges 122a-122b) can be placed into a liquid-filled container, which can, for example, establish an isothermal environment for the reference test cell 112 and the sample test cell 114.

In this example of the gas porosimeter 102, the grain density of the untreated rock sample 104 can be determined according to Boyle's law (or by the Boyle's law technique). Boyle's law states that that a pressure (P) of a given quantity of gas varies inversely with its volume (V) at constant temperature (for example, under isothermal conditions). In this example, the grain density of the untreated rock sample 104 (as a whole) can be measured by determining a volume of the untreated rock sample 104 within the sample test cell 114 with reference to a known volume of the reference test cell 112 (and measured pressures in each cell). For example, the pressurized gas 111 is introduced into the reference test cell 112 and sealed there within (for example, with valves 120a and 120b). A pressure of the reference test cell 112 is measured by the pressure gauge 122a to determine a reference pressure (Pr). The valve 120b is then opened to fluidly connect the reference test cell 112 to the sample test cell 114 and allow molecules of the pressurized gas 111 from the reference test cell 112 to be forced into the untreated rock sample 104. The pressure of the sample test cell 114 ($P_s$) is then recorded by the pressure gauge 122b. Based on the measured pressures ($P_r$ and $P_s$). Grain volume of the untreated rock sample 104 can be calculated based on the known volumes of the reference test cell 112 and the sample test cell 114 and a ratio of the measured pressures. From grain volume, grain density of the untreated rock sample 104 can be calculated. The pressurized gas 111 can eventually be released through an outlet 118 of the conduits 116.

As shown, the control system 999 is communicably coupled to the gas porosimeter 102 by a data connection 990a (wired or wireless). The control system 999, in some embodiments, can be implemented as a micro-processor based controller system (or multiple control systems, or controllers, communicably coupled together). However, the control system 999 can be implemented as a mechanical, electro-mechanical, or pneumatic control system, or a combination thereof.

The control system 999, in this example implementation, is communicably coupled through data connection 990a to one or more components of the gas porosimeter 102, such as the valves 120a-120c (and other valves or flow control devices, not shown) and the pressure gauges 122a-122b. For example, control instructions can be provided through data connection 990a from the control system 999 to one or more of the valves 120a-120c (for example, instructions to open, close, or modulate between open and closed). As another example, measured data can be provided through data connection 990a from the pressure gauges 122a-122b to the control system 999 (for example, pressure data measured on command or periodically, or both). Thus, operations of the gas porosimeter 102 described previously can be implemented or controlled by the control system 999 through data connection 990a.

As further shown in the example system 100, an NMR measurement device (or system) 103 is also included and operable to measure a volume of the fluid 108 entrained in the untreated rock sample 104. The NMR measurements can be used to correct the measured grain density of the untreated rock sample 104 from the gas porosimeter 102 in order to determine a grain density of the solid matrix 106 (exclusive of the fluid 108) of the untreated rock sample 104.

The example implementation of the NMR device 103 includes a magnet 128 that is positionable about the untreated rock sample 104 and controllable to produce a homogeneous magnetic field around the untreated rock sample 104. A radio frequency (RF) transmitter 124 includes a coil 132 that is wound about the untreated rock sample 104 and produces an electromagnetic radiation about the untreated rock sample 104. An RF receiver 126 includes a coil 130 that is operable to detect signals produced by a resonating nuclei of the untreated rock sample 104. In this example, the control system 999 (or part of the control system) is communicably coupled to the NMR device 103 through data communication 990b (wired or wirelessly).

In operation, the untreated rock sample 104 can be placed in the NMR device 103 (for example, prior to the measurement of grain density of the sample 104 by the gas porosimeter 102). The magnet 128 is operated (for example, energized by the control system 999) to produce the magnetic field about the untreated rock sample 104. The NMR active nuclei in the untreated rock sample 104 each has a magnetic moment, which collectively combine to form a net macroscopic magnetization vector that is aligned with the static magnetic field generated by the magnet 128. Next, electric currents are generated in the coil 132 of the RF transmitter 124 (as controlled, for example, by the control system 999) to form a secondary oscillating magnetic field about the untreated rock sample 104. This causes the macroscopic magnetization to rotate (for example, 90°) into a particular planar field (for example, x-y plane). After excitation, the net macroscopic magnetization processes around the primary static magnetic field and returns to, for example, a vertical plane (z plane). Weak currents (decay) are induced and measured in the coil 130 of the RF receiver 126 (and provided to the control system 999 through data communication 990b). The measured decay current, also called a resonance signal or Free Induction Decay (FID), can be recorded as a function of time. Further NMR measurements can be taken, such as relaxation times, $T_1$ (longitudinal relaxation times, which is the time constant which determines the rate at which excited protons in the untreated rock sample 104 return to equilibrium) and $T_2$ (transverse relaxation time, which is a time constant which determines the rate at which excited protons in the untreated rock sample 104 reach equilibrium or go out of phase with each other). In some aspects, one or more of the NMR measurements (FID, $T_1$, and/or and $T_2$) can be used (for example, by the control system 999) to determine, for example, a volume of the fluid 108 in the untreated rock sample 104. For example, in some aspects, the $T_1$ or $T_2$ values or not directly used to measure the volume of fluid 108 entrained in the solid matrix 106 but, instead, the volume is obtained from the overall NMR signal or the integration of the acquired $T_1$ or $T_2$ spectrum on the untreated rock sample 104.

Figure 2:
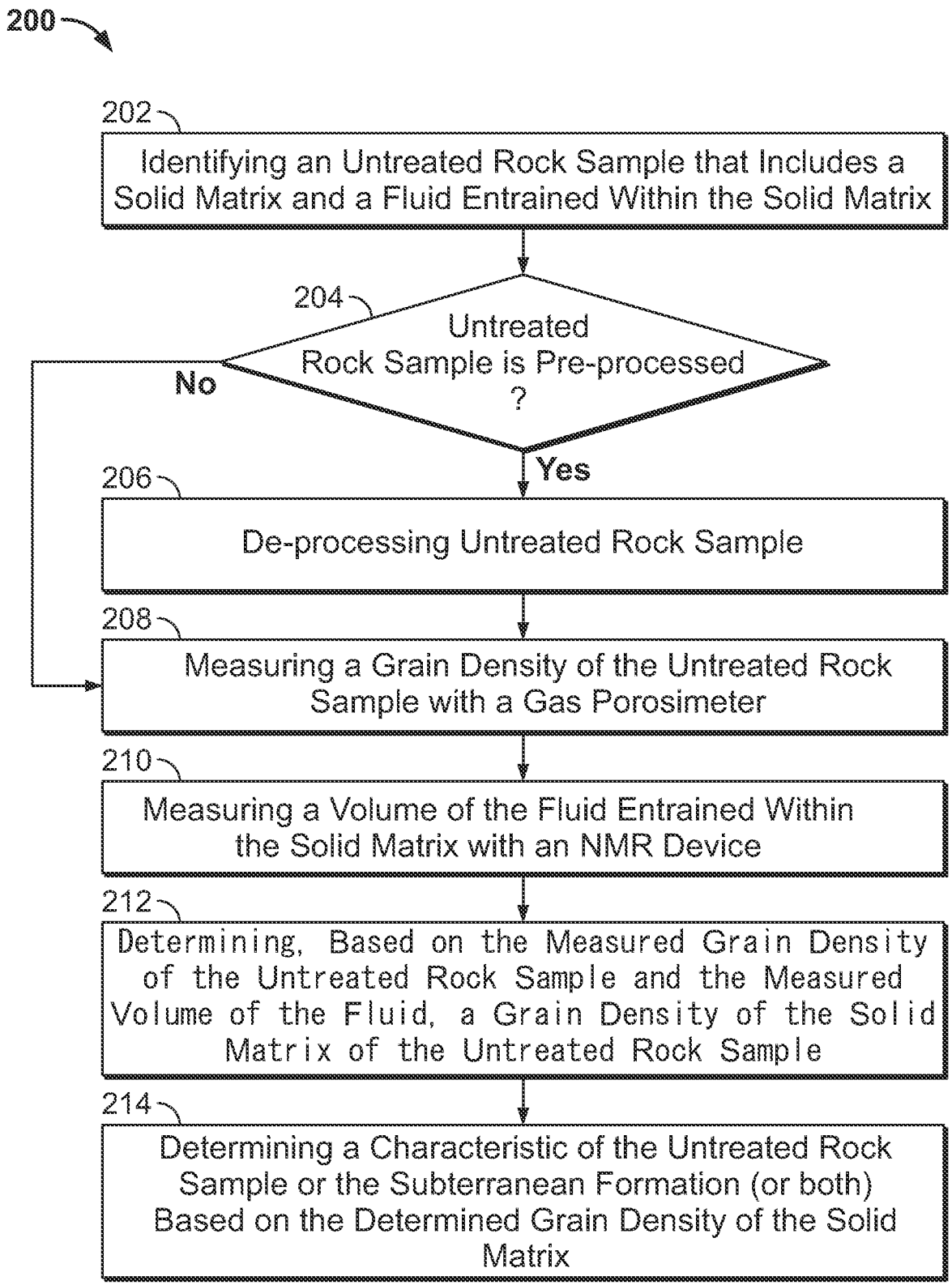
FIG. 2 is a flowchart that describes an example method for determining a grain density of a rock sample according to the present disclosure.

FIG. 2 is a flowchart that describes an example method 200 for determining a grain density of a rock sample according to the present disclosure. For example, method 200 can be performed with or by the system 100 shown in FIG. 1, including, for example, one or more steps performed with or by the control system 999. Method 200 can begin at step 202, which includes identifying an untreated rock sample that includes a solid matrix and a fluid entrained within the solid matrix. For example, an untreated rock sample can be removed from a subterranean formation, such as through a drilled wellbore, for analysis by a system for determining a grain density. The untreated rock sample, such as a core sample, is formed from a solid matrix and also includes a fluid, such as a liquid, entrained within pores of the untreated rock sample that are formed by the solid matrix. The rock sample can be "untreated" in that no chemical cleaning or drying of the rock sample has taken place subsequent to its removal from the subterranean formation. In some aspects, the untreated rock sample can be taken from an unconventional reservoir, such as shale.

Method 200 can continue at step 204, which includes a determination of whether the untreated rock sample is pre-processed. For example, although the rock sample is "untreated," there can still be some "processing" of the rock sample subsequent to its removal from the subterranean formation. Processing, according to the present disclosure, can include, for example, sealing the rock sample against an ambient environment (for example, outdoor or indoor ambient air). In some aspects, therefore, the untreated rock sample can be sealed within a container or a flexible barrier (for example, plastic wrap, aluminum foil, or wax (or a combination thereof) subsequent to its removal from the subterranean formation.

If the determination in step 204 is yes, then method 200 can continue at step 206, which includes de-processing untreated rock sample. For example, in the case of an untreated rock sample that has been sealed against an ambient environment, the untreated rock sample can be removed from the seal (container or flexible barrier) prior to proceeding with step 206

Method 200 can continue from step 206, or from step 204 based on a "no" determination, to step 208, which includes measuring a grain density of the untreated rock sample with a gas porosimeter. For example, the untreated rock sample can be placed in the gas porosimeter, such as a Boyle's law dual cell gas porosimeter, in order to measure a grain density of the untreated rock sample (as a whole, including the solid matrix and entrained fluid) as previously described with reference to system 100 in FIG. 1. Subsequent to step 208, therefore, a control system (such as control system 999) implementing all or a portion of method 200 can store the measured grain density, $\rho_g^{g.p.}$, of the untreated rock sample according to gas porosimetry.

Method 200 can continue at step 210, which includes measuring a volume of the fluid entrained within the solid matrix with an NMR device. For example, the untreated rock sample can be placed in the NMR device in order to measure a volume of the fluid (for example, liquid) entrained in the solid matrix of the untreated rock sample as previously described with reference to system 100 in FIG. 1. Subsequent to step 210, therefore, a control system (such as control system 999) implementing all or a portion of method 200 can store the measured fluid volume, $v_f$, of the untreated rock sample according to the NMR measurements.

Method 200 can continue at step 212, which includes determining, based on the measured grain density of the untreated rock sample and the measured volume of the fluid, a grain density of the solid matrix of the untreated rock sample. For example, grain density of the solid matrix of the untreated rock sample and the measured grain density of the untreated rock sample (as a whole) can be related by:

$$\rho_g^{g.p.} = \rho_g(1-\phi_f) + \rho_f\phi_f \qquad \text{Eq. 1}$$

In Eq. 1, $\rho_g$ is the grain density of the solid matrix, $\rho_g^{g.p.}$ is the measured grain density of the untreated rock sample, $\rho_f$ is the density of the fluid entrained within the solid matrix, and $\phi_f$ is the porosity of the fluid entrained within the solid matrix. In step 212, the density of the fluid entrained in the solid matrix can be determined, for example, by identification of the fluid. For example, in some aspects, the fluid can be positively identified (for example, as water or other known fluid) and, therefore, the density of the fluid is known (for example, without measurement). In some aspects, the type of fluid can be estimated by the NMR measurements taken in step 210, such as from the $T_2$ relaxation values.

In step 212, the porosity of the fluid can be determined by the measured volume of fluid from step 210. For example, porosity of the fluid is related to fluid volume and the bulk volume of the untreated rock sample according to:

$$\phi_f = \frac{v_f}{v_b}, . \qquad \text{Eq. 2}$$

In Eq. 2, $v_b$ is the bulk volume of the untreated rock sample (which can be measured in a conventional manner). Thus, once the volume of the fluid entrained in the untreated rock sample is measured in step 210, the porosity of the fluid can be determined in step 212.

Eq. 1 can be rearranged to solve for the grain density of the solid matrix:

$$\rho_g = \frac{(\rho_g^{g.p.} - \rho_f\phi_f)}{(1-\phi_f)}, . \qquad \text{Eq. 3}$$

Method 200 can continue at step 214, which includes determining a characteristic of the untreated rock sample or the subterranean formation (or both) based on the determined grain density of the solid matrix. For example, several characteristics of the untreated rock sample or a subterranean formation from which the untreated rock sample was obtained can be determined once the grain density of the solid matrix. For example, a rock type of the untreated rock sample, a reservoir type of the subterranean formation, or a formation porosity of the subterranean formation can be determined or estimated based on the determined grain density of the solid matrix of the untreated rock sample. Such information can be used, for example, to guide hydraulic fracturing operations and decisions, as well as other completion decisions of a reservoir.

FIG. 3 is a table 300 that shows measured and determined parameters of a system for determining a grain density of a rock sample according to the present disclosure. For example, an experimental procedure was performed on 22 untreated rock samples (numbered 1-22 as shown in column 302). Each sample, in this experimental procedure, was obtained from a shale formation of a reservoir located in the Middle East. In this example, a density of the fluid entrained in the solid matrix of each sample was assumed to be 1 gram/milliliter. As shown in table 300, column 304 shows the measured fluid porosity (as a percentage) from the NMR measurements of each sample. Column 306 shows, for each sample, a measured grain density of the sample (as a whole) from the gas porosimetry. Column 308 shows the determined grain density of the solid matrix of each sample from the combination of 304 and 306 according to the procedure set forth in method 200. In this experimental procedure, each sample was a tight rock or source rock sample that was measured (for example, by the NMR device and gas porosimeter) in the as-received state (in other words, untreated without chemical cleaning or drying).

Figure 4:
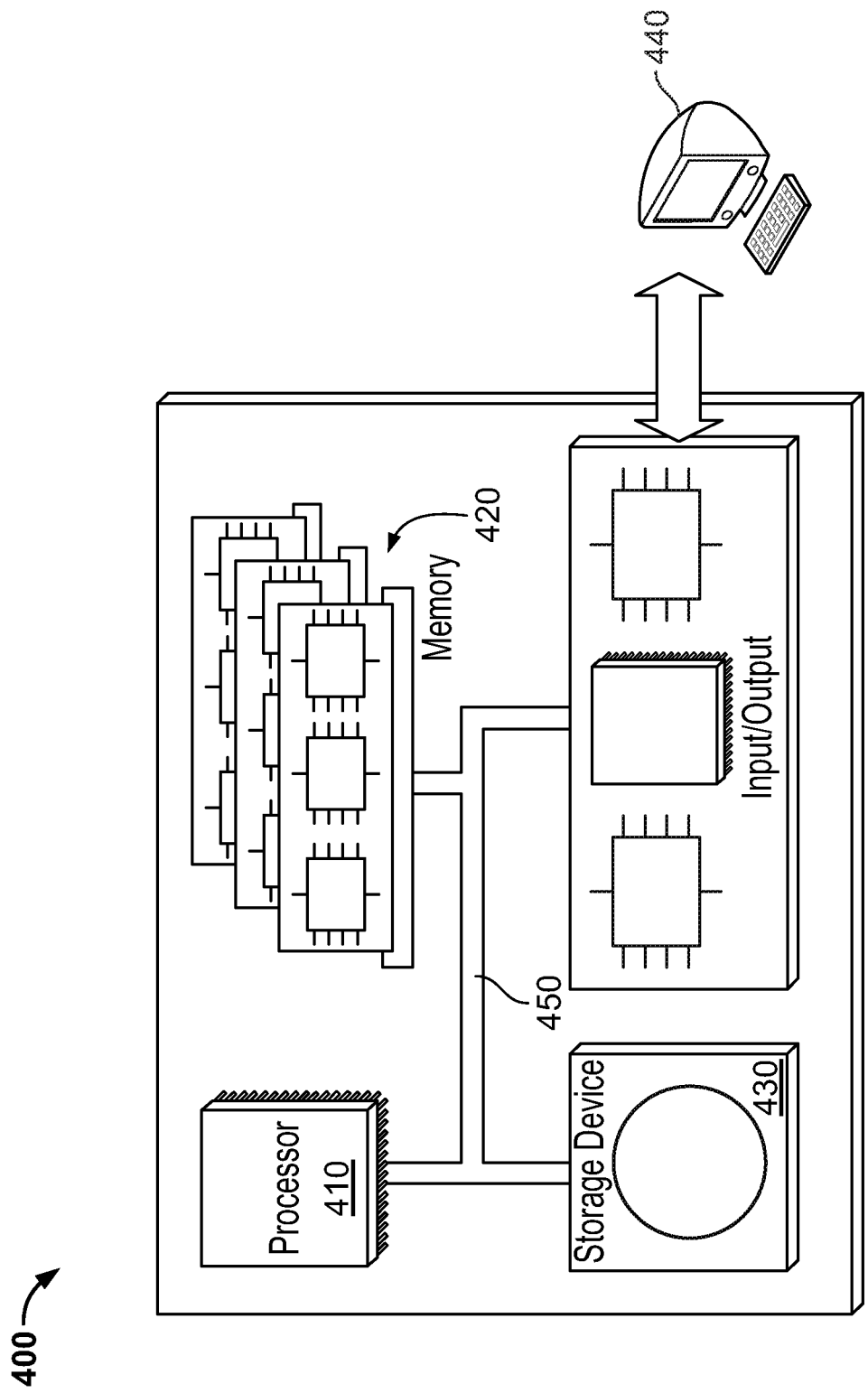
FIG. 4 is a control system (or controller) for a system for determining a grain density of a rock sample according to the present disclosure.

FIG. 4 is a control system (or controller) 400 for a system for determining a grain density of a rock sample (such as system 100 shown in FIG. 1) according to the present disclosure. For example, all or parts of the controller 400 can be used for the operations described previously, for example as or as part of the control system 999 shown in FIG. 1. In some aspects, the control system 400 can represent one of multiple control systems 999 used in the system of FIG. 1. The controller 400 is intended to include various forms of digital computers, such as printed circuit boards (PCB), processors, digital circuitry, or otherwise. Additionally the system can include portable storage media, such as, Universal Serial Bus (USB) flash drives. For example, the USB flash drives may store operating systems and other applications. The USB flash drives can include input/output components, such as a wireless transmitter or USB connector that may be inserted into a USB port of another computing device.

The controller 400 includes a processor 410, a memory 420, a storage device 430, and an input/output device 440. Each of the components 410, 420, 430, and 440 are interconnected using a system bus 450. The processor 410 is capable of processing instructions for execution within the controller 400. The processor may be designed using any of a number of architectures. For example, the processor 410 may be a CISC (Complex Instruction Set Computers) processor, a RISC (Reduced Instruction Set Computer) processor, or a MISC (Minimal Instruction Set Computer) processor.

In one implementation, the processor 410 is a single-threaded processor. In another implementation, the processor 410 is a multi-threaded processor. The processor 410 is capable of processing instructions stored in the memory 420 or on the storage device 430 to display graphical information for a user interface on the input/output device 440.

The memory 420 stores information within the controller 400. In one implementation, the memory 420 is a computer-readable medium. In one implementation, the memory 420 is a volatile memory unit. In another implementation, the memory 420 is a non-volatile memory unit.

The storage device 430 is capable of providing mass storage for the controller 400. In one implementation, the storage device 430 is a computer-readable medium. In various different implementations, the storage device 430 may be a floppy disk device, a hard disk device, an optical disk device, a tape device, flash memory, a solid state device (SSD), or a combination thereof.

The input/output device 440 provides input/output operations for the controller 400. In one implementation, the input/output device 440 includes a keyboard and/or pointing device. In another implementation, the input/output device 440 includes a display unit for displaying graphical user interfaces.

The features described can be implemented in digital electronic circuitry, or in computer hardware, firmware, software, or in combinations of them. The apparatus can be implemented in a computer program product tangibly embodied in an information carrier, for example, in a machine-readable storage device for execution by a programmable processor; and method steps can be performed by a programmable processor executing a program of instructions to perform functions of the described implementations by operating on input data and generating output. The described features can be implemented advantageously in one or more computer programs that are executable on a programmable system including at least one programmable processor coupled to receive data and instructions from, and to transmit data and instructions to, a data storage system, at least one input device, and at least one output device. A computer program is a set of instructions that can be used, directly or indirectly, in a computer to perform a certain activity or bring about a certain result. A computer program can be written in any form of programming language, including compiled or interpreted languages, and it can be deployed in any form, including as a stand-alone program or as a module, component, subroutine, or other unit suitable for use in a computing environment.

Suitable processors for the execution of a program of instructions include, by way of example, both general and special purpose microprocessors, and the sole processor or one of multiple processors of any kind of computer. Generally, a processor will receive instructions and data from a read-only memory or a random access memory or both. The essential elements of a computer are a processor for executing instructions and one or more memories for storing instructions and data. Generally, a computer will also include, or be operatively coupled to communicate with, one or more mass storage devices for storing data files; such devices include magnetic disks, such as internal hard disks and removable disks; magneto-optical disks; and optical disks. Storage devices suitable for tangibly embodying computer program instructions and data include all forms of non-volatile memory, including by way of example semiconductor memory devices, such as EPROM, EEPROM, solid state drives (SSDs), and flash memory devices; magnetic disks such as internal hard disks and removable disks; magneto-optical disks; and CD-ROM and DVD-ROM disks. The processor and the memory can be supplemented by, or incorporated in, ASICs (application-specific integrated circuits).

To provide for interaction with a user, the features can be implemented on a computer having a display device such as a CRT (cathode ray tube) or LCD (liquid crystal display) or LED (light-emitting diode) monitor for displaying information to the user and a keyboard and a pointing device such as a mouse or a trackball by which the user can provide input to the computer. Additionally, such activities can be implemented via touchscreen flat-panel displays and other appropriate mechanisms.

The features can be implemented in a control system that includes a back-end component, such as a data server, or that includes a middleware component, such as an application server or an Internet server, or that includes a front-end component, such as a client computer having a graphical user interface or an Internet browser, or any combination of them. The components of the system can be connected by any form or medium of digital data communication such as a communication network. Examples of communication networks include a local area network ("LAN"), a wide area network ("WAN"), peer-to-peer networks (having ad-hoc or static members), grid computing infrastructures, and the Internet.

While this specification contains many specific implementation details, these should not be construed as limitations on the scope of any inventions or of what may be claimed, but rather as descriptions of features specific to particular implementations of particular inventions. Certain features that are described in this specification in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products.

A number of implementations have been described. Nevertheless, it will be understood that various modifications may be made without departing from the spirit and scope of the disclosure. For example, example operations, methods, or processes described herein may include more steps or fewer steps than those described. Further, the steps in such example operations, methods, or processes may be performed in different successions than that described or illustrated in the figures. Accordingly, other implementations are within the scope of the following claims.

What is claimed is:

1. A method of determining grain density of a rock sample, comprising:
   (i) identifying an untreated rock sample that comprises a solid matrix and a fluid entrained within the solid matrix;
   (ii) measuring, using a gas porosimeter, a grain density of the untreated rock sample;
   (iii) measuring, using nuclear magnetic resonance (NMR), a volume of the fluid entrained within the solid matrix; and
   (iv) determining, based on the measured grain density of the untreated rock sample and the measured volume of the fluid, a grain density of the solid matrix of the untreated rock sample.

2. The method of claim 1, wherein the untreated rock sample is free from chemical cleaning subsequent to removal of the untreated rock sample from a subterranean formation.

3. The method of claim 2, wherein the untreated rock sample is pre-processed prior to step (i).

4. The method of claim 3, further comprising de-processing the untreated rock sample prior to step (ii).

5. The method of claim 2, further comprising, based on the determined grain density of the solid matrix, determining at least one of:
   a rock type of the untreated rock sample;
   a reservoir type of the subterranean formation; or
   a formation porosity of the subterranean formation.

6. The method of claim 1, wherein the untreated rock sample comprises a cylindrical plug.

7. The method of claim 6, wherein the cylindrical plug is 1 inch in diameter and about 1 inch in length.

8. The method of claim 1, wherein step (ii) comprises measuring the grain density of the untreated rock sample using the gas porosimeter using a Boyle's law technique with an inert gas.

9. The method of claim 8, wherein the inert gas comprises at least one of nitrogen, helium, or argon.

10. The method of claim 1, wherein step (iii) comprises measuring, using NMR, the volume of the fluid entrained within the solid matrix with at least one of $T_1$ or $T_2$ measurements of the untreated rock sample.

11. The method of claim 1, wherein step (iii) comprises:
    determining a density of the fluid entrained within the solid matrix; and
    determining a porosity of the fluid entrained within the solid matrix based on the determined volume of the fluid and a volume of the untreated rock sample.

12. The method of claim 11, wherein determining the density of the fluid entrained within the solid matrix comprises:
    identifying a type of the fluid based on at least one of $T_1$ or $T_2$ measurements; and
    determining the density of the fluid based on the identified type of the fluid.

13. The method of claim 11, wherein step (iv) comprises determining the grain density of the solid matrix of the untreated rock sample based on the determined density and porosity of the fluid entrained within the solid matrix and the determined grain density of the untreated rock sample.

14. The method of claim 13, wherein determining the grain density of the solid matrix of the untreated rock sample based on the determined density and porosity of the fluid entrained within the solid matrix and the measured grain density of the untreated rock sample comprises determining the grain density of the solid matrix from:

$$\rho_g = \frac{(\rho_g^{g.p.} - \rho_f \phi_f)}{(1 - \phi_f)},$$

where
$\rho_g$ is the grain density of the solid matrix, $\rho_g^{g.p.}$ is the measured grain density of the untreated rock sample, $\rho_f$ is the determined density of the fluid entrained within the solid matrix, and $\rho_f$ is the determined porosity of the fluid entrained within the solid matrix.

15. A system for determining grain density of a rock sample, comprising:
    a gas porosimeter configured to determine a grain density of an untreated rock sample that comprises a solid matrix and a fluid entrained within the solid matrix;
    a nuclear magnetic resonance (NMR) measurement device configured to determine one or more NMR measurements of the untreated rock sample; and a control system configured to perform operations comprising:
  identifying a measured grain density of the untreated rock sample from the gas porosimeter;
  determining a measured volume of the fluid entrained within the solid matrix from the one or more NMR measurements; and
  determining, based on the measured grain density of the untreated rock sample and the measured volume of the fluid, a grain density of the solid matrix of the untreated rock sample.

16. The system of claim 15, wherein the untreated rock sample is free from chemical cleaning subsequent to removal of the untreated rock sample from a subterranean formation.

17. The system of claim 16, wherein the untreated rock sample comprises a de-processed, untreated rock sample.

18. The system of claim 17, wherein the de-processed, untreated rock sample comprises the untreated rock sample unsealed from an ambient environment.

19. The system of claim 16, wherein the control system is configured to perform operations further comprising at least one of:
  a rock type of the untreated rock sample based on the determined grain density of the solid matrix;
  a reservoir type of the subterranean formation based on the determined grain density of the solid matrix; or
  a formation porosity of the subterranean formation based on the determined grain density of the solid matrix.

20. The system of claim 15, wherein the untreated rock sample comprises a cylindrical plug.

21. The system of claim 20, wherein the cylindrical plug is 1 inch in diameter and about 1 inch in length.

22. The system of claim 15, wherein the gas porosimeter is configured to determine the grain density by measuring the grain density of the untreated rock sample using a Boyle's law technique with an inert gas.

23. The system of claim 22, wherein the inert gas comprises at least one of nitrogen, helium, or argon.

24. The system of claim 15, wherein the one or more NMR measurements comprise at least one of $T_1$ or $T_2$ measurements of the untreated rock sample.

25. The system of claim 15, wherein the operation of determining the measured volume of the fluid entrained within the solid matrix from the one or more NMR measurements comprises:
  determining a density of the fluid entrained within the solid matrix based on the one or more NMR measurements; and
  determining a porosity of the fluid entrained within the solid matrix based on the determined volume of the fluid and a volume of the untreated rock sample.

26. The system of claim 25, wherein determining the density of the fluid entrained within the solid matrix comprises:
  identifying a type of the fluid based on the one or more NMR measurements; and
  determining the density of the fluid based on the identified type of the fluid.

27. The system of claim 25, wherein the operation of determining, based on the measured grain density of the untreated rock sample and the measured volume of the fluid, the grain density of the solid matrix of the untreated rock sample comprises:
  determining the grain density of the solid matrix of the untreated rock sample based on the determined density and porosity of the fluid entrained within the solid matrix and the determined grain density of the untreated rock sample.

28. The system of claim 27, wherein the operation of determining the grain density of the solid matrix of the untreated rock sample based on the determined density and porosity of the fluid entrained within the solid matrix and the measured grain density of the untreated rock sample comprises determining the grain density of the solid matrix from:

$$\rho_g = \frac{(\rho_g^{g.p.} - \rho_f \phi_f)}{(1 - \phi_f)},$$

where
  $\rho_g$ is the grain density of the solid matrix, $\rho_g^{g.p.}$ is the measured grain density of the untreated rock sample, $\rho_f$ is the determined density of the fluid entrained within the solid matrix, and $\rho_f$ is the determined porosity of the fluid entrained within the solid matrix.

29. The system of claim 15, wherein the control system is configured to perform operations further comprising at least one of:
  controlling the gas porosimeter to determine the grain density of an untreated rock sample; or
  controlling the NMR measurement device to determine the one or more NMR measurements of the untreated rock sample.

30. A computer-implemented method performed with a computing system that comprises one or more hardware processors, the method comprising:
  operating, with the one or more hardware processors, a gas porosimeter to measure a pressure of a pressurized gas in the gas porosimeter that encloses an untreated rock sample that comprises a solid matrix and a fluid entrained within the solid matrix;
  determining, with the one or more hardware processors, a value of a measurement of a grain density of the untreated rock sample based at least in part on the measured pressure of the pressurized gas;
  determining, with the one or more hardware processors, a value of a measurement of a volume taken by a nuclear magnetic resonance (NMR) device of the fluid entrained within the solid matrix; and
  determining, with the one or more hardware processors, a grain density of the solid matrix of the untreated rock sample based on the measured value of the grain density of the untreated rock sample and the measured value of the volume of the fluid.

31. The computer-implemented method of claim 30, wherein the untreated rock sample is free from chemical cleaning subsequent to removal of the untreated rock sample from a subterranean formation.

32. The computer-implemented method of claim 31, further comprising, based on the determined grain density of the solid matrix, determining, with the one or more hardware processors, at least one of:
  a rock type of the untreated rock sample;
  a reservoir type of the subterranean formation; or
  a formation porosity of the subterranean formation.

33. The computer-implemented method of claim 30, wherein the measurement of the grain density of the untreated rock sample taken by the gas porosimeter comprises a measurement of the grain density of the untreated rock sample taken by the gas porosimeter using a Boyle's law technique with an inert gas.

34. The computer-implemented method of claim 30, wherein the measurement of the volume of the fluid entrained within the solid matrix taken by the NMR device comprises one or more $T_1$ or $T_2$ measurements of the untreated rock sample.

35. The computer-implemented method of claim 30, wherein determining the value of the measurement of the volume taken by the NMR device of the fluid entrained within the solid matrix comprises:

determining, with the one or more hardware processors, a density of the fluid entrained within the solid matrix; and determining, with the one or more hardware processors, a porosity of the fluid entrained within the solid matrix based on the determined volume of the liquid and a volume of the untreated rock sample.

36. The computer-implemented method of claim 35, wherein determining the density of the fluid entrained within the solid matrix comprises:

identifying, with the one or more hardware processors, a type of the fluid based on the NMR measurements; and determining, with the one or more hardware processors, the density of the fluid based on the identified type of the fluid.

37. The computer-implemented method of claim 35, wherein determining the grain density of the solid matrix of the untreated rock sample comprises:

determining, with the one or more hardware processors, the grain density of the solid matrix of the untreated rock sample based on the determined density and porosity of the fluid entrained within the solid matrix and the determined grain density of the untreated rock sample.

38. The computer-implemented method of claim 37, wherein determining the grain density of the solid matrix of the untreated rock sample based on the determined density and porosity of the fluid entrained within the solid matrix and the measured grain density of the untreated rock sample comprises determining, with the one or more hardware processors, the grain density of the solid matrix from:

$$\rho_g = \frac{(\rho_g^{g.p.} - \rho_f \phi_f)}{(1 - \phi_f)},$$

where $\rho_g$ is the grain density of the solid matrix, $\rho_g^{g.p.}$ is the measured grain density of the untreated rock sample, $\rho_f$ is the determined density of the fluid entrained within the solid matrix, and $\rho_f$ is the determined porosity of the fluid entrained within the solid matrix.

* * * * *